United States Patent [19]

Negley

[11] Patent Number: 5,923,946
[45] Date of Patent: Jul. 13, 1999

[54] RECOVERY OF SURFACE-READY SILICON CARBIDE SUBSTRATES

[75] Inventor: Gerald H. Negley, Hillsborough, N.C.

[73] Assignee: Cree Research, Inc., Durham, N.C.

[21] Appl. No.: 08/840,961

[22] Filed: Apr. 17, 1997

Related U.S. Application Data

[51] Int. Cl.$^6$ ..................................................... H01L 21/00
[52] U.S. Cl. ................................................. 438/4; 438/931
[58] Field of Search ....................... 438/4, 931, FOR 434, 438/745, FOR 396; 257/77

[56] References Cited

U.S. PATENT DOCUMENTS

| | | |
|---|---|---|
| 3,923,567 | 12/1975 | Lawrence . |
| 4,009,299 | 2/1977 | Flowers et al. . |
| 4,891,325 | 1/1990 | Hezel et al. . |
| 5,030,536 | 7/1991 | Pai et al. ................................. 430/127 |
| 5,131,979 | 7/1992 | Lawrence . |
| 5,393,993 | 2/1995 | Edmond et al. ........................... 257/77 |
| 5,424,254 | 6/1995 | Damiot . |
| 5,523,589 | 6/1996 | Edmond et al. ........................... 257/77 |
| 5,654,208 | 8/1997 | Harris et al. ............................. 438/522 |

FOREIGN PATENT DOCUMENTS

| | | |
|---|---|---|
| 50-113500 | 9/1975 | Japan . |
| 53-043480 | 4/1978 | Japan . |
| 56-087383 | 7/1981 | Japan . |
| 2228470 | 9/1990 | Japan . |

OTHER PUBLICATIONS

Hughes, W.C., et al.; "Reactive Ion Etching of AlN, AlGaN, and GaN using BCl/sub 3/" Gallium Nitride and Related Materials. First International Symposium, Boston, Nov. 27–Dec. 1, 1995, 1996, Pittsburgh, Mater, Res. Soc., USA, pp. 757–762, XP002072134.

Hidenao Tanaka et al.,; "Reactive Fast Atom Beam Etching of a Wide–Gap Semiconductor GaN," Optoelectronics Devices and Technologies, vol. 6, No. 1, Jun. 1, 1991, pp. 150–153.

*Patterning of AlN, InN, and GaN in KOH–Based Solutions*, J. R. Mileham et al., J. Vac. Sci. Technol. A, vol. 14, No. 3, May/Jun. 1996, pp. 836–839.

*Etching of GaN Using Phosphoric Acid*, A. Shintani et al., J. Electrochem. Soc.: Solid–State Science and Technology, May 1976, pp. 706–713.

*Preparation and Properties of Aluminum Nitride Films Using An Organometallic Precursor*, L. V. Interrante et al., Journal of the Electrochemical Society, V. 136, N. 2, Feb. 1989, pp. 472–478 (Abstract Only).

*Primary Examiner*—Mary Wilczewski
*Attorney, Agent, or Firm*—Philip Summa, Patent Attorney

[57] ABSTRACT

A method is disclosed for recovering surface-ready silicon carbide substrates from heteroepitaxial structures of Group III nitrides on silicon carbide substrates. The method comprises subjecting a Group III nitride epitaxial layer on a silicon carbide substrate to a stress that sufficiently increases the number of dislocations in the epitaxial layer to make the epitaxial layer subject to attack and dissolution in a mineral acid, but that otherwise does not affect the silicon carbide substrate, and thereafter contacting the epitaxial layer with a mineral acid to remove the Group III nitride while leaving the silicon carbide substrate unaffected.

22 Claims, No Drawings

RECOVERY OF SURFACE-READY SILICON CARBIDE SUBSTRATES

FIELD OF THE INVENTION

The present invention relates to the manufacture of semiconductor devices from wide-bandgap materials, and in particular relates to a method of recovering silicon carbide substrates from composite structures of such substrates with Group III nitride epitaxial layers.

BACKGROUND OF THE INVENTION

The present invention relates to the recent increase in the research, development, manufacture and use of electronic devices made from wide-bandgap semiconductors, specifically including silicon carbide (SiC) and Group III nitrides (i.e. Group III of the Periodic Table: B, Al, Ga, In, Tl) such as gallium nitride (GaN). Both of these materials have generated such interest for several reasons. Silicon carbide is an attractive candidate material for semiconductor applications because of its wide bandgap (2.99 eV for α-SiC at 300K) and its other exceptional electronic, physical, thermal and chemical properties.

Gallium nitride, although not sharing all of the same physical properties as silicon carbide offers the electronic advantage of being a wide-bandgap (3.36 eV at 300K) direct-transition emitter. Stated somewhat differently, both silicon carbide and gallium nitride are ideal candidate materials for producing light emitting diodes (LEDs) that because of their wide bandgaps, are capable of emitting at higher energies. In terms of the characteristics of light, higher energy represents higher frequencies and longer wavelengths. In particular, gallium nitride and silicon carbide have bandgaps sufficiently wide to allow them to emit light in the blue portion of the visible spectrum (i.e. wavelengths of between about 455 and 492 nanometers, nm), a color that cannot be directly produced by most other semiconductor materials. A thorough discussion of optoelectronic devices, and their design, the theory behind their operation, is set forth in Sze, *Physics of Semiconductor Devices*, (1981), and particularly in Chapter 12, pages 681–742, with related discussions of photodetectors in Chapter 13 (page 743) and solar cells in Chapter 14 (page 790). Such background and theory will not be discussed further herein other than as necessary to describe the present invention.

In brief, however, silicon carbide is an indirect emitter, which means that a portion of the energy generated by each transition is generated as vibrational energy rather than as emitted light. In comparison, gallium nitride is a direct emitter in which all of the energy generated by a transition is emitted as light. Thus, at any given current input, gallium nitride offers the possibility for more efficient LEDs, than does silicon carbide. To date, however, gallium nitride has not been produced in bulk crystal form, and thus in order to form an LED or other optoelectronic device from gallium nitride, epitaxial layers of gallium nitride must be formed on some suitable substrate material.

Conventionally, sapphire has been the preferred substrate material for gallium nitride because of its physical properties and because of the generally satisfactory crystal lattice match between gallium nitride and sapphire ($Al_2O_3$). Sapphire cannot be made electronically conductive, however, and thus the physical geometry of LEDs formed from gallium nitride epitaxial layers on sapphire substrates are typically of the "same side" variety rather than the generally more preferred "vertical" LED geometry. As used herein, the term "vertical" refers to an LED in which the ohmic contacts can be placed on opposite faces of the device rather than on a common face.

Accordingly, and in addition to its own advantageous electronic properties, silicon carbide provides an excellent substrate material for gallium nitride and other Group III nitride devices. Accordingly, many recent advances in the production of blue LEDs have been based upon a combination of such gallium nitride epitaxial layers on silicon carbide substrates.

Although the manufacture of such GaN-SiC devices has progressed rapidly, epitaxial growth of such materials such as gallium nitride on silicon carbide continues to represent a complex process, and one in which a substantial proportion of attempts produce device precursors that are unsatisfactory for one or more reasons.

More particularly, a GaN on SiC LED typically consists of an SiC substrate with a back ohmic contact, one or more buffer layers on the SiC substrate that provide a crystal lattice transition between the SiC and the GaN, and at least two epitaxial layers of gallium nitride on the buffer layer. The gallium nitride layers include at least one p-type layer and one n-type layer adjacent one another to form the p-n junction of the device. A top ohmic contact is usually made to the top layer of gallium nitride, or in some cases to another material that for some other desired reason forms the top layer of the device.

As well known to those of ordinary skill in this industry, semiconductor substrates are typically sliced from bulk crystals in the form of circular disks, generally referred to as "wafers," upon which various other layers, such as epitaxial layers of GaN, are formed. Because the bulk growth of silicon carbide and the preparation of silicon carbide wafers are both processes which represent significant technical challenge and economic investment, the wafers are in turn quite valuable. If, however, after the gallium nitride epitaxial layers are grown on the SiC wafer, they are found to be defective, or simply unsatisfactory from a desired quality standpoint, the entire wafer becomes a waste product.

Thus, a need exists for removing gallium nitride from silicon carbide in a manner that preserves the silicon carbide wafer. Interestingly enough, the recent success of high quality epitaxial growth of gallium nitride on silicon carbide has exacerbated this problem. Namely, the high quality gallium nitride (and other Group III nitride) epitaxial layers required to produce appropriate LEDs, are similarly much more resistant to the normal techniques (typically wet or dry etching) used to remove unwanted material in conventional semiconductor processes.

OBJECT AND SUMMARY OF THE INVENTION

Therefore, it is an object of the present invention to provide a method of recovering surface-ready silicon carbide substrates from heteroepitaxial structures of Group III nitrides on silicon carbide substrates, particularly when the Group III nitride layers are high quality crystalline materials.

The invention meets this object with the method of recovering such substrates by subjecting a Group III nitride epitaxial layer on a silicon carbide substrate to a stress that sufficiently increases the number of dislocations in the epitaxial layer to make the epitaxial layer subject to attack and dissolution in a mineral acid, but that otherwise does not affect the silicon carbide substrate, and thereafter contacting the epitaxial layer with a mineral acid to remove the Group III nitride while leaving the silicon carbide substrate unaffected.

DETAILED DESCRIPTION

The invention is a method of recovering surface-ready silicon carbide substrates from heteroepitaxial structures of Group III nitrides on silicon carbide substrates. The method comprises subjecting the Group III nitride epitaxial layer on a silicon carbide substrate to a stress that sufficiently increases the number of dislocations in the epitaxial layer to make the epitaxial layer subject to attack and dissolution in a mineral acid, but that otherwise does not affect the silicon carbide substrate. Thereafter, the epitaxial layer is contacted with a mineral acid to remove the Group III nitride while leaving the silicon carbide substrate unaffected.

Because gallium nitride is the most commonly used Group III nitride for LEDs, the specification will often refer to gallium nitride. It will be understood, however, that the invention embraces all of the Group III nitrides described above, including binary, ternary, and tertiary nitrides. Such binary nitrides also include aluminum nitride (AlN) and indium nitride (InN). Ternary nitrides include those often referred to as "aluminum gallium nitride," and which are typically designated by the empirical formula $Al_xGa_{1-x}N$. It will be understood that this general formula is used to refer to a variety of aluminum gallium nitride compounds that are in many ways similar, but that differ according to the atomic fractions of aluminum and gallium, with somewhat differing properties as well.

Tertiary Group III nitrides refer for example to indium aluminum gallium nitride, which is similarly designated $In_xAl_yGa_{1-x-y}N$. The reasons for using gallium nitride, aluminum gallium nitride, or other ternary or tertiary nitrides are set forth in exemplary, but certainly not limiting, fashion in U.S. Pat. No. 5,523,589 which is commonly assigned with the present invention, and in copending applications Ser. Nos. 08/309,247, filed Sep. 20, 1994 for, "Low Strain Laser Structures With Group III Nitride Active Layers," and 08/436,141 filed May 8, 1995 for, "Double Heterojunction Light Emitting Diode With Gallium Nitride Active Layer," both of which are also commonly assigned with the present invention.

Although the inventors do not wish to be bound by any particular theory of the invention, it appears that recent successes in the crystal growth of Group III nitrides on silicon carbide has produced high quality Group III nitride layers whose crystal structure is less susceptible to wet chemical attack than are Group III nitride layers produced by other techniques. Thus, although in one sense gallium nitride and other Group III nitrides have been recognized as being susceptible to wet chemical etch, the higher quality Group III nitrides produced more recently are not so susceptible. Accordingly, it appears that these higher quality gallium nitride epitaxial layers must be physically brought to a lower quality ("the stress step") before they can be successfully attacked with a wet chemical etch such as a mineral acid.

Furthermore, it will be understood that the crystal defects referred to herein, although frequently labelled as "dislocations," include, but are not limited to, slips, edge dislocations, and screw dislocations.

Accordingly, in preferred embodiments of the invention, there are several techniques for applying the stress.

A first technique is to raise the temperature of the substrate and the epitaxial layers to a temperature sufficient to dissociate the gallium nitride. In more preferred embodiments, this technique comprises heating the substrate and epitaxial layers to temperatures of about 1000° C. in the presence of oxygen or argon. The equipment used for these heating steps is otherwise conventional in this art, and can be used to practice the invention without undue experimentation.

In another embodiment, the stress step comprises exposing the substrate and epitaxial layers to rapid thermal annealing (RTA). As used herein, rapid thermal annealing refers to the technique generally well understood in the semiconductor arts in which an item such as a semiconductor material is placed in a device that, because of its physical capabilities, can raise the temperature of the semiconductor material very quickly; i.e. on the order of about 10° C. per second. Again, although not wishing to be bound by any particular theory, it appears that when the lattice mismatch between the gallium nitride and silicon carbide (even in the presence of a buffer layer) is subjected to such rapid thermal stress (which is not expected in any ordinary use of the device), the mismatch creates or increases the number of defects in the crystal, particularly dislocation defects, that permit the mineral acid to attack and remove the Group III nitride.

In some embodiments, the rapid thermal annealing is carried out at relatively low pressure (e.g. about $10^{-6}$ torr), while in other circumstances, the rapid thermal annealing can be carried out in an ambient atmosphere (air) at high temperatures (e.g. 1,050° C.).

In yet another embodiment, the step of subjecting the Group III nitride layer to stress can comprise physically abrading the layer, for example by bombarding it with silicon carbide or aluminum oxide powders. It presently appears, however, that such physical abrasion methods may cause underlying damage to the silicon carbide substrate as well, which is a less desirable result.

In the preferred embodiments of the method, the step of contacting the epitaxial layer with a mineral acid comprises contacting the layer with phosphoric acid ($H_3PO_4$). Most preferably 85% $H_3PO_4$ heated to about 170° C. is used to remove the nitride epitaxial layers. In a preferred embodiment, the etching apparatus comprises a quartz beaker and a Wollam condenser. The condenser keeps the $H_3PO_4$ solution at 85% by preventing water from evaporating.

As noted above, the difficulty in removing the gallium nitride from the substrate relates back to the quality of the gallium nitride epitaxial layer, which in turn relates back to the method by which it is produced. Thus, in another aspect, the invention comprises the step of depositing the Group III nitride epitaxial layer on the substrate prior to the step of subjecting the layer to stress. More particularly, it has been found that electronically high quality Group III nitride epitaxial layers, and thus those hardest to remove, tend to be produced by metal organic chemical vapor deposition (MOCVD), and are typically of higher quality than those produced by vapor phase epitaxy (VPE). Although these processes are to a great extent similar, as used herein, vapor phase epitaxy refers to processes such as those in which a gas (such as a blend of hydrogen chloride and hydrogen) is bubbled through liquid gallium to produce a gallium chloride vapor, which is then directed to react with a nitrogen containing gas, typically ammonia ($NH_3$), to form gallium nitride. Some VPE processes seem to inherently form dislocations and tend to capture chloride atoms or chloride ions in the resulting material.

Alternatively, MOCVD uses a metal organic compound (in which the Group III element is the metal) in the vapor phase. To some extent, the vapor phase compound will dissociate to form metal radicals. These radicals in turn react with the nitrogen containing gas (again typically ammonia) to form the Group III nitride. Trimethyl gallium ("TMG", $(CH_3)_3Ga$) is a preferred metal organic source for gallium.

Thus, in the present invention the step of depositing the Group III nitride epitaxial layer on the silicon carbide substrate preferably comprises MOCVD. In turn, the MOCVD is preferably carried out from a vapor phase reaction between an organic Group III compound such as TMG, and ammonia ($NH_3$).

It will be understood, however, that the invention is not limited by the method in which the Group III nitride layers are deposited. Other appropriate methods can include (but are not limited to) molecular beam epitaxy (MBE), the aforementioned VPE, and liquid phase epitaxy (LPE).

It has also come to be recognized in recent years that an appropriate buffer layer or layers positioned between the silicon carbide substrate and the gallium nitride epitaxial layers, can greatly improve the quality of those epitaxial layers. Thus, a preferred embodiment of the present invention further comprises depositing such a buffer layer on the silicon carbide substrate prior to the step of depositing the Group III nitride epitaxial layers. Appropriate buffer layers are described in several of the patents already cited as well in U.S. Pat. No. 5,393,993, which is commonly assigned with the present invention, and which is incorporated entirely herein by reference. The method of the invention removes these buffer layers as well.

In summary, the invention produces a silicon carbide wafer that is otherwise indistinguishable from wafers that have never carried Group III nitride epitaxial layers. Such recovered wafers can accordingly be used or processed in the same manner as "new" wafers, thus offering significant gains in the efficiency and economy of wafer and device production.

In the specification, there have been set forth preferred and exemplary embodiments, which have been included by way of example and not limitation, the scope of invention being set forth in the following claims.

That which is claimed:

1. A method of recovering surface-ready silicon carbide substrates from heteroepitaxial structures of Group III nitrides on silicon carbide substrates, the method comprising:

subjecting a Group III nitride epitaxial layer on a silicon carbide substrate to a stress that sufficiently increases the number of dislocations in the epitaxial layer to make the epitaxial layer subject to attack and dissolution in a mineral acid, but that otherwise does not affect the silicon carbide substrate; and thereafter contacting the epitaxial layer with a mineral acid to remove the Group III nitride while leaving the silicon carbide substrate unaffected.

2. A method according to claim 1 wherein the step of subjecting the Group III nitride layer to stress comprises subjecting a layer of $Al_xGa_{1-x}N$ to stress.

3. A method according to claim 1 wherein the step of subjecting the Group III nitride layer to stress comprises subjecting a gallium nitride layer to stress.

4. A method according to claim 1 wherein the stress step comprises heating the substrate and epitaxial layer to a temperature sufficient to cause the epitaxial layer to dissociate.

5. A method according to claim 1 wherein the stress step comprises subjecting the substrate and epitaxial layer to rapid thermal annealing.

6. A method according to claim 5 where in the rapid thermal annealing is carried out at low pressure.

7. A method according to claim 5 wherein the rapid thermal annealing is carried out in an ambient atmosphere at high temperature.

8. A method according to claim 1 wherein the step of contacting the epitaxial layer with a mineral acid comprises contacting the layer with phosphoric acid.

9. A method according to claim 1 wherein the step of subjecting the Group III nitride layer to stress comprises physically abrading the layer.

10. A method according to claim 1 and further comprising the step of depositing the Group III nitride epitaxial layer on the substrate prior to the step of subjecting the layer to stress.

11. A method of recovering surface-ready silicon carbide substrate from heteroepitaxial structures of Group III nitrides on silicon carbide substrates, the method comprising:

depositing a Group III nitride epitaxial layer on silicon carbide substrate;

subjecting the Group III nitride epitaxial layer to a stress that sufficiently increases the number of dislocations in the epitaxial layer to make the epitaxial layer subject to attack and dissolution in phosphoric acid, but that otherwise does not affect the silicon carbide substrate; and thereafter contacting the epitaxial layer with hot concentrated phosphoric acid to thereby remove the Group III nitride while leaving the silicon carbide substrate unaffected.

12. A method according to claim 11 wherein the step of depositing the Group III nitride epitaxial layer on the silicon carbide substrate comprises metal organic chemical vapor deposition.

13. A method according to claim 12 wherein the step of depositing the Group III nitride epitaxial layer on the silicon carbide substrate comprises depositing the Group III nitride from a vapor phase reaction between an organic Group III compound and ammonia.

14. A method according to claim 12 wherein the step of depositing the Group III nitride epitaxial layer on the silicon carbide substrate comprises depositing gallium nitride from a vapor phase reaction between trimethyl gallium and ammonia.

15. A method according to claim 11 wherein the step of depositing the Group III nitride epitaxial layer on the silicon carbide substrate further comprises depositing a buffer layer on the silicon carbide substrate prior to the step of depositing the Group III nitride epitaxial layer.

16. A method according to claim 11 wherein the step of depositing the Group III nitride layer comprises depositing a layer of $Al_xGa_{1-x}N$.

17. A method according to claim 11 wherein the stress step comprises heating the substrate and epitaxial layer to a temperature sufficient to dissociate the epitaxial layer.

18. A method according to claim 11 wherein the stress step comprises subjecting the substrate and epitaxial layer to rapid thermal annealing.

19. A method according to claim 18 wherein the rapid thermal annealing is carried out at low pressure.

20. A method according to claim 18 wherein the rapid thermal annealing is carried out in an ambient atmosphere at high temperature.

21. A method according to claim 11 wherein the step of subjecting the Group III nitride layer to stress comprises physically abrading the layer.

22. A method according to claim 11 wherein the step of depositing the Group III nitride layer is selected from the group consisting of molecular beam epitaxy, vapor phase epitaxy, and liquid phase epitaxy.

* * * * *